US011019753B2

(12) United States Patent
James et al.

(10) Patent No.: US 11,019,753 B2
(45) Date of Patent: May 25, 2021

(54) COOLING ELECTRONIC DEVICES WITHIN A DATA CENTER

(71) Applicant: Microsoft Technology Licensing, LLC, Redmond, WA (US)

(72) Inventors: Sean Michael James, Olympia, WA (US); Eric C. Peterson, Woodinville, WA (US); Michael Rees Helsel, Seattle, WA (US); Nicholas Andrew Keehn, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 244 days.

(21) Appl. No.: 15/634,051

(22) Filed: Jun. 27, 2017

(65) Prior Publication Data

US 2018/0376623 A1   Dec. 27, 2018

(51) Int. Cl.
| | |
|---|---|
| *H05K 7/20* | (2006.01) |
| *G05D 23/20* | (2006.01) |
| *H05K 7/14* | (2006.01) |
| *G06F 1/20* | (2006.01) |
| *G05D 23/19* | (2006.01) |

(52) U.S. Cl.
CPC ..... *H05K 7/20836* (2013.01); *G05D 23/1917* (2013.01); *G05D 23/2039* (2013.01); *G06F 1/20* (2013.01); *G06F 1/206* (2013.01); *H05K 7/1489* (2013.01); *H05K 7/20* (2013.01); *H05K 7/20727* (2013.01); *H05K 7/20745* (2013.01); *H05K 7/20809* (2013.01); *H05K 7/2039* (2013.01); *H05K 7/20336* (2013.01)

(58) Field of Classification Search
CPC .......... G06F 1/20; H05K 7/1489; H05K 7/20; H05K 7/20336; H05K 7/2039; H05K 7/20745; H05K 7/20809; H05K 7/20836; G05D 23/2039

USPC .................................................. 361/679.47
See application file for complete search history.

(56) References Cited

U.S. PATENT DOCUMENTS

| | | | | |
|---|---|---|---|---|
| 5,913,034 A | * | 6/1999 | Malcolm ................. | H04L 41/00 709/223 |
| 6,442,030 B1 | * | 8/2002 | Mammoser ........... | G06F 1/1601 248/917 |
| 7,125,272 B1 | * | 10/2006 | Liang ................... | H05K 7/1489 439/160 |
| 2005/0286222 A1 | | 12/2005 | Lucero et al. | |
| 2007/0042514 A1 | | 2/2007 | Wu et al. | |

(Continued)

OTHER PUBLICATIONS

Ahuja, et al., "Data Center Efficiency with Higher Ambient Temperatures and Optimized Cooling Control", In Proceedings of 27th Annual IEEE Semiconductor Thermal Measurement and Management Symposium, Mar. 20, 2011, 5 pages.

Primary Examiner — Anatoly Vortman
Assistant Examiner — Zhengfu J Feng
(74) Attorney, Agent, or Firm — Liang IP, PLLC

(57) ABSTRACT

In an example, a server system is provided. The server system includes a frame including a support structure and a server supported by the support structure. The server system includes an actuator configured to cause the server to transition from a first position to a second position to increase exposure of the server to airflow to transfer heat away from the server via convection. The actuator is also configured to cause the server to transition from the second position to the first position to decrease exposure of the server to the airflow.

20 Claims, 9 Drawing Sheets

(56) References Cited

U.S. PATENT DOCUMENTS

| | | |
|---|---|---|
| 2009/0016019 A1 | 1/2009 | Bandholz et al. |
| 2009/0046427 A1* | 2/2009 | Noteboom ......... H05K 7/20745 361/695 |
| 2009/0323280 A1* | 12/2009 | Wu .................... H05K 7/20209 361/690 |
| 2011/0128697 A1 | 6/2011 | Schott |
| 2013/0033815 A1 | 2/2013 | Yang et al. |
| 2014/0055959 A1* | 2/2014 | Manda ................. G11B 33/128 361/728 |
| 2014/0073234 A1 | 3/2014 | Elison et al. |
| 2014/0118924 A1 | 5/2014 | Magarelli |
| 2016/0095250 A1 | 3/2016 | Shelnutt et al. |
| 2016/0353598 A1 | 12/2016 | Chen et al. |

* cited by examiner

COOLING ELECTRONIC DEVICES WITHIN A DATA CENTER

FIELD

The present disclosure relates to systems and methods for cooling electronic equipment, such as computer servers and related equipment in data centers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Datacenters house bulk data storage and computing resources such as physical machines, virtual machines, and containers. Data service providers rent the data storage and computing resources to tenants. As the demand increases, packing of the data storage and computing resources also increases. For example, a server room in the datacenter may include a large number of racks of computing and storage devices including servers, routers and hard disk drives. Each of these storage and computing devices generates heat during operation. If the ambient temperature in the server room increases too high, performance decreases and/or damage may occur due to overheating.

SUMMARY

In an example, a server system is provided. The server system includes a frame including a support structure and a server supported by the support structure. The server system includes an actuator configured to cause the server to transition from a first position to a second position to increase exposure of the server to airflow to transfer heat away from the server via convection. The actuator is also configured to cause the server to transition from the second position to the first position to decrease exposure of the server to the airflow.

In other features, the server system includes a heat sink mounted on the server and a sensor mounted to the heat sink or the server. The sensor is configured to measure a heat load associated with the server. The server system includes a controller configured to cause the actuator to actuate the server from the first position to the second position when the heat load exceeds a predetermined heat load. In other features, the heat load includes a temperature associated with the server or an operational characteristic associated with the server. In other features, the actuator is configured to cause the server to rotate relative to the frame.

In other features, the server system includes an axle connected to the server and a gear assembly connected to the axle. The gear assembly is rotationally connected to the actuator. The axle causes the server to rotate when the actuator causes the gear assembly to rotate. In other features, the actuator is configured to cause the server to extend or retract with respect to the frame.

In other features, the server system includes an inner support structure connected to the support structure and configured to retain the server and a roller assembly connected to the actuator and the inner support structure. The roller assembly is configured to extend or retract the inner support structure with respect to the support structure. In other features, the roller assembly includes a roller and an axle. The roller is connected to the axle and the axle is rotationally connected to the actuator.

In other features, the server system includes a server interface configured to connect with the server. In other features, the server system includes one or more extendable connectors configured to connect the server with the server interface. In other features, the actuator includes a heat-activated actuator connected to the server. In other features, the heat-activated actuator includes a shape-memory alloy.

In an example, a server system is provided. The server system includes a frame including a support structure and a server supported by the support structure. The server system includes a heat-activated actuator connected to the server. The heat-activated actuator is configured to cause the server to transition from a retracted position to an extended position to increase exposure of the server to airflow to transfer heat away from the server via convection when a temperature of the heat-activated actuator exceeds a predetermined temperature.

In other features, the heat-activated actuator comprises a shape-memory alloy. In other features, the server system includes a heat sink mounted on the server and a heat pipe having an inlet and an outlet. The inlet is in thermal communication with the heat sink, and the outlet is in thermal communication with the heat-activated actuator. In other features, the support structure includes an elastic device that is configured to cause the server to transition from the extended position to the retracted position when the temperature of the heat-activated actuator is below the predetermined temperature. In other features, the elastic device includes a compression spring.

In an example, a server system is provided. The server system includes a frame including a support structure and a server supported by the support structure. The server includes an electronic device and an expandable heat sink mounted thereon. The expandable heat sink is in thermal communication with the electronic device and is configured to expand to increase exposure of the expandable heat sink to airflow to transfer heat away from the expandable heat sink via convection when heat associated with the expandable heat sink exceeds an expansion temperature.

In other features, the expandable heat sink includes a shape-memory alloy. In other features, the server system includes a guiding structure. The expandable heat sink is disposed within the guiding structure to guide the expandable heat sink during expansion and retraction.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

In the drawings, reference numbers may be reused to identify similar and/or identical elements.

DESCRIPTION

Datacenters, server rooms, and other facilities operate a large number of heat-generating devices such as servers, routers, bulk data storage devices such as hard disk drives, or other electronic devices in close proximity. For example, a facility may include blade servers. A blade server is a self-contained computer server used within high-density computing environments and can be housed within a frame (i.e., a blade enclosure).

Cooling systems may be used to prevent failure due to overheating. In some instances, airflow is used to cool the heat-generating devices. For example, forced convection may be generated by providing a cooling airflow over the heat-generating devices. Fans located within these facilities force the cooling airflow through the surrounding environment, and the cooling airflow flows over the heat-generating devices to remove heat generated by the heat-generating devices.

Systems and methods according to the present disclosure relate to a server system that is configured to increase exposure of a server to airflow to remove heat proximate to the server via convection.

Figure 1:
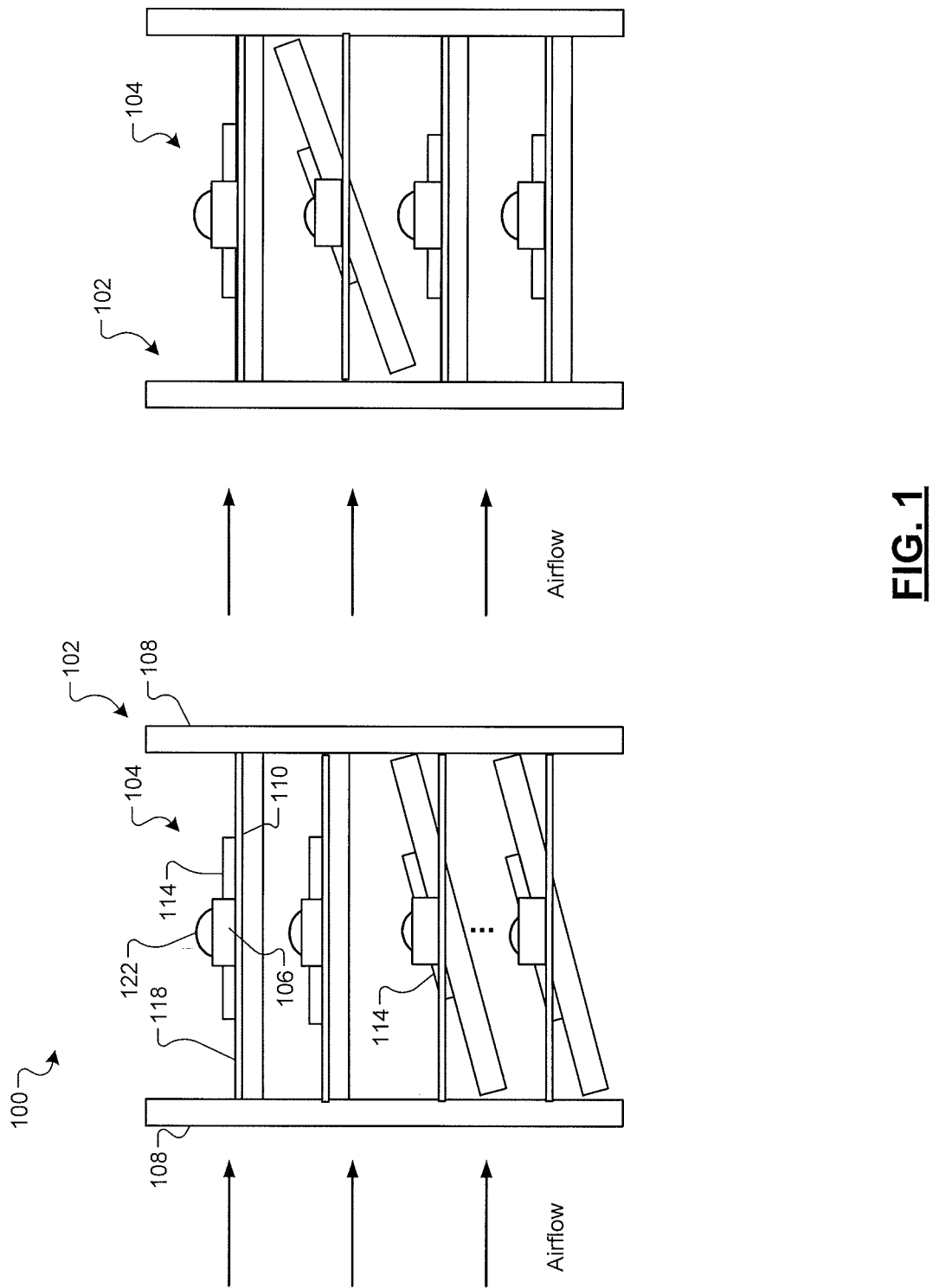
FIG. 1 is a side view of a server system in accordance with an example embodiment of the present disclosure.

FIG. 1 illustrates an example server system 100 in accordance with example embodiments of the present disclosure. The server system 100 includes a frame 102, servers 104, and actuators 106. The frame 102 includes vertical posts 108 and lateral support structures 110. The frame 102 is configured to receive multiple servers 104. In an embodiment, the servers 104 include server blades, and the frame 102 may be a blade enclosure structure, a rack mounted structure, or the like. It is understood that multiple server systems 100 may be deployed within the environments described below. For example, multiple server systems 100 can be deployed adjacent to other server systems 100 utilizing the embodiments described herein.

In embodiments, the actuator 106 includes a mechanical device or an electro-mechanical device, such as a piston-cylinder, a motor, or the like, that receives actuator control signals from a controller 112. The controller 112 generates the actuator control signal based upon one or more operating condition parameters of the server 104 as described in greater detail herein.

A heat sink 114 is in thermal communication with one of the servers 104. In one example, the heat sink 114 transfers the heat generated by the servers 104 to a fluid medium, such as air. In some examples, the heat sink 114 includes a base and a plurality of fins extending therefrom. The heat sink 114 can be made of metal, such as aluminum alloys, copper, other composite materials, combinations thereof, or the like. In an example embodiment, the heat sink 114 is directly mounted to the server 104 to maintain thermal communication between the server 104 and the heat sink 114. For example, the heat sink 114 may be attached to the server 104 using thermally conductive adhesive, thermally conductive double-sided tap, epoxy, or fasteners such as clips, push pins, screws, bolts, or the like.

The lateral support structures 110 are disposed within the frame 102 to define multiple server receiving bays. In an embodiment, the lateral support structures 110 are fixedly attached to vertical posts 108 of the frame 102. For example, the lateral support structures 110 can be welded to the vertical posts 108. In another example, the lateral support structures 110 are removably fastened to the vertical posts 108 using fasteners, such as bolts, screws, or the like. In various embodiments, the lateral support structures 110 include rail structures or track structures as described in further detail herein.

The actuators 106 are connected to respective ones of the lateral support structures 110. The actuators 106 are configured to transition the servers 104 between one or more positions to increase or decrease exposure of one or more components of the server 104 to airflow for convection purposes. In an embodiment, the actuators 106 cause the servers 104 to selectively rotate to different angular positions to increase the exposure of the heat sinks 114 and/or electronic components of the server 104 to airflow.

Figure 2:
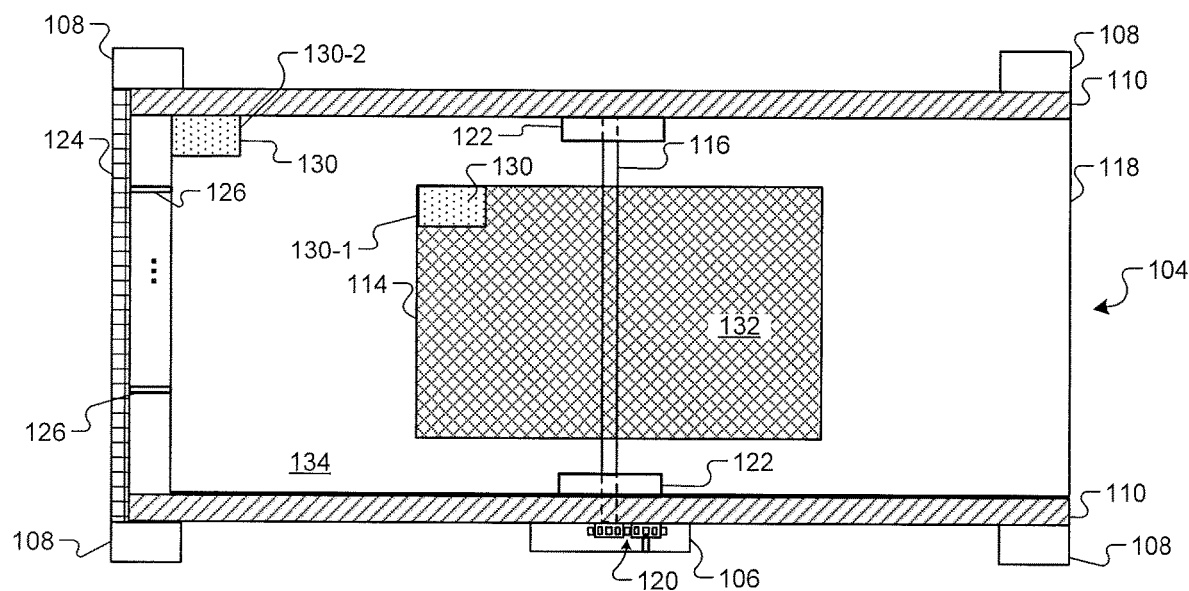
FIG. 2 is a plan view of the server system in accordance with an example embodiment of the present disclosure.

As shown in FIG. 2, the server system 100 includes an axle 116 that is connected to a housing 118 of the server 104. The actuator 106 includes a gear assembly 120 mounted to the axle 116. The gear assembly 120 includes a plurality of gears that are driven by the actuator 106 to rotate the axle 116. In another embodiment, the actuator 106 directly drives the axle 116. The housing 118 includes one or more printed circuit boards (i.e., motherboards) and associated electronic components. The axle 116 can be attached to the housing 118 by way of an axle receiving portion 122. In embodiments, the axle receiving portion 122 is fixedly attached to the housing 118. For example, the axle receiving portion 122 can be fastened to the housing 118 using bolts, screws, or the like. In another example, the axle receiving portion 122 can be welded to the housing 118.

Additionally, the server system 100 includes a server interface 124. The server interface 124 includes connectors that connect with the housing 118 to establish a connection between the server 104 and other servers 104 and/or external devices.

Figure 3A:
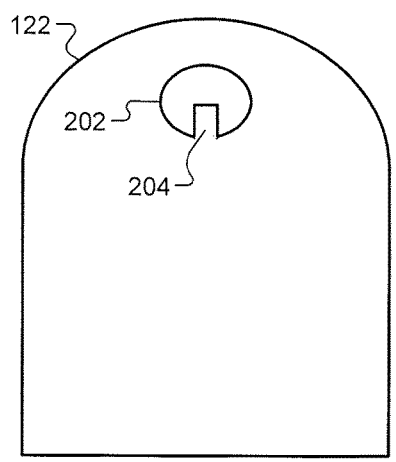
FIG. 3A is a side view of an axle receiving portion in accordance with an example embodiment of the present disclosure.
Figure 3B:
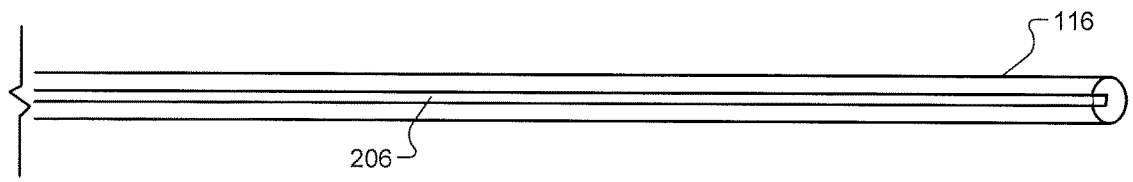
FIG. 3B is a side view of an axle in accordance with an example embodiment of the present disclosure.

As shown in FIG. 3A, the axle receiving portion 122 defines an aperture 202 for receiving the axle 116 and a spline portion 204 to engage with a corresponding grooved portion 206 (see FIG. 3B) of the axle 116. In an embodiment, the actuator 106 rotates the gear assembly 120, which causes the axle 116 to rotate. The axle 116 exerts a force on the axle receiving portion 122, which causes the housing 118 to rotate.

In an example embodiment, as shown in FIG. 2, the server system 100 includes one or more extendable connectors 126 that connect the servers 104 to the server interface 124. In an embodiment, the extendable connectors 126 expand and contract as needed based upon a rotational or translational state of the server 104.

For example, when the actuator 106 causes the server 104 to rotate, the extendable connectors 126 transition from a non-extended state to an extended state, or vice versa. The extendable connectors 126 include cables capable of having varying lengths when connected between the server 104 and the server interface 124. In one example, the length of the cable can be greater than the distance between the server 104 and the server interface 124. In another example, the cable can include a retractable cable that transitions between a non-extended state and an extended state, and vice versa. Once the connection is established, the electronic devices of the server 104 receive power from and/or exchange data with the other servers 104 and/or external devices.

Figure 4:
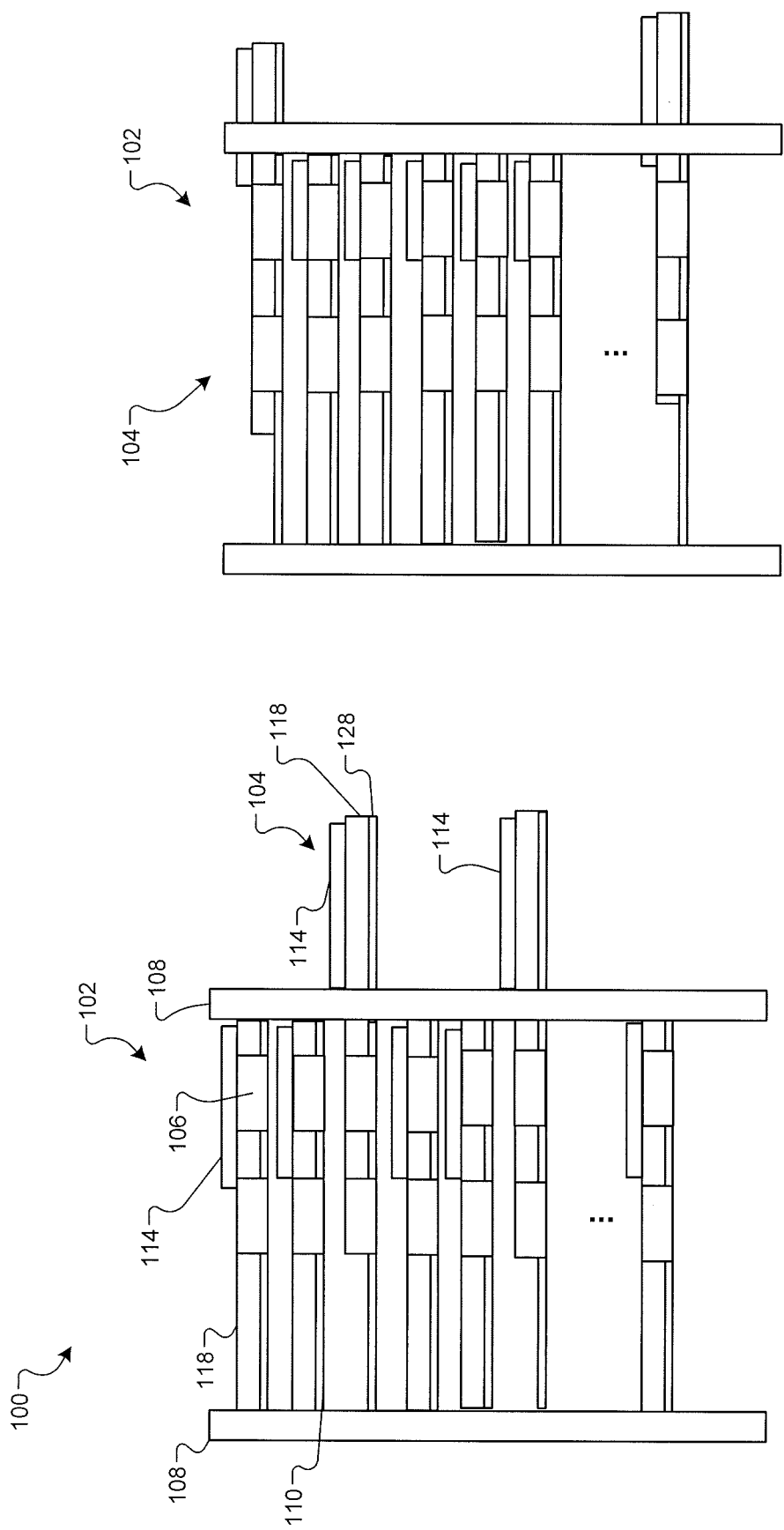
FIG. 4 is a side view of a server system in accordance with an example embodiment of the present disclosure.
Figure 5:
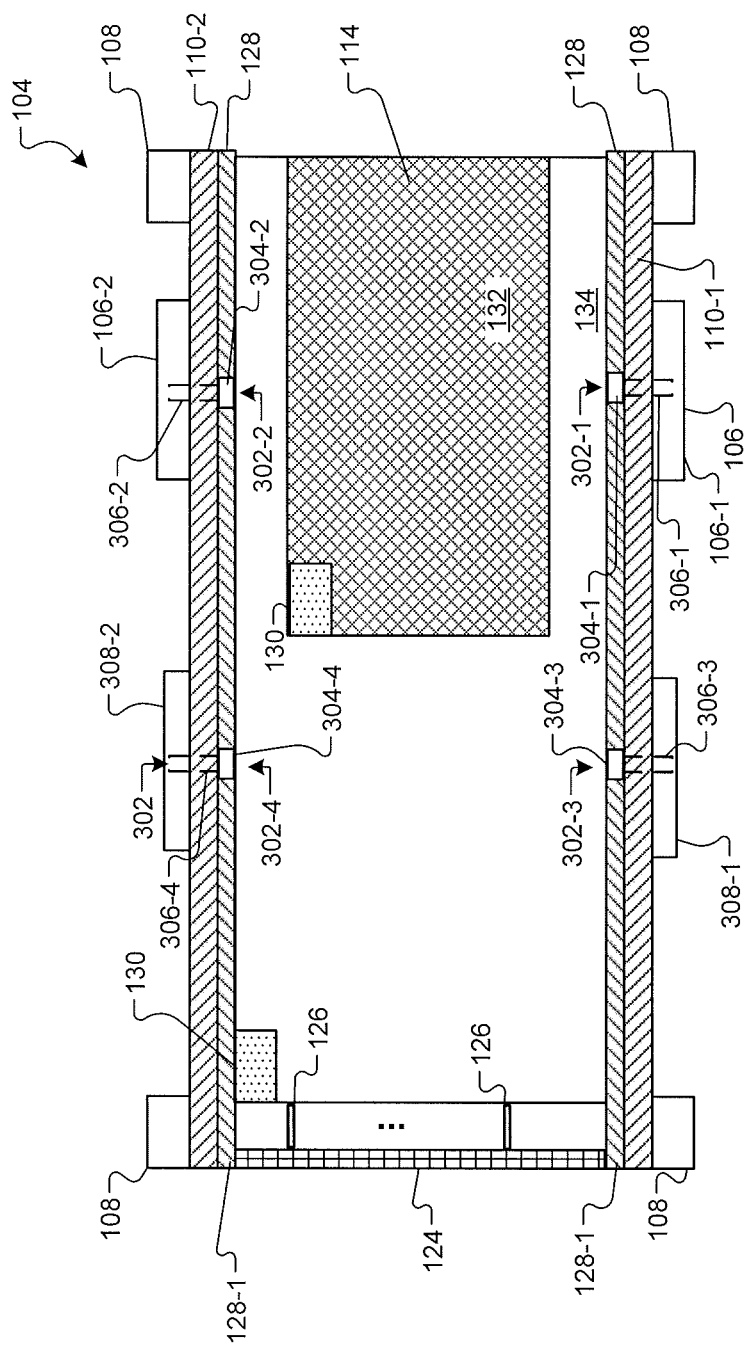
FIG. 5 is a plan view of the server system in accordance with an example embodiment of the present disclosure.

FIGS. 4 and 5 illustrate another example embodiment of the server system 100. As shown, the server system 100 includes support structures 128 (i.e., an inner support structure), such as support structures 128-1, 128-2, and a plurality of roller assemblies 302. The support structures 128 are disposed laterally within the frame 102. The support structures 128 are fixedly attached to the housing 118 and can be disposed adjacent to the support structures 110. The roller assemblies 302 support the support structures 128. In various embodiments, the support structures 128 include track structures to receive the roller assemblies 302. As shown in FIG. 5, the server system 100 includes one or more actuators 106. For example, a first actuator 106-1 is connected to a first roller assembly 302-1, and a second actuator 106-2 is connected to a second roller assembly 302-2.

The first roller assembly 302-1 includes a roller 304-1 and an axle 306-1. The actuator 106-1 is connected to the axle 306-1, and the axle 306-1 is connected to the roller 304-1. For example, the axle 306-1 extends through an aperture defined within the lateral support structure 110-1. The roller 304-1 engages a first support structure 128-1 such that the roller 304-1 can extend or retract the first support structure 128-1. Additionally, the second actuator 106-2 is connected to an axle 306-2, and the axle 306-2 is connected to a roller 304-2. The axle 306-2 can extend through an aperture defined within the lateral support structure 110-2. The roller 304-2 engages a second support structure 128-2 such that the roller 304-2 can extend or retract the second support structures 128-2 In some examples, the roller assemblies 302 and the support structures 128 include a rack-and-pinion configuration.

Additionally, the server system 100 also includes a third roller assembly 302-3 and a fourth roller assembly 302-4. The third roller assembly 302-3 and the fourth roller assembly 302-4 include respective axles 306-3, 306-4 that are received by a corresponding axle receiving structure 308-1, 308-2. The axle receiving structures 308-1, 308-2 are fixedly attached to the lateral support structures 110-1, 110-2, respectively. The axles 306-3, 306-4 are also connected to respective rollers 304-3, 304-4, and the rollers 304-3, 304-4 engage the respective support structures 128-1, 128-2.

Figure 6A:
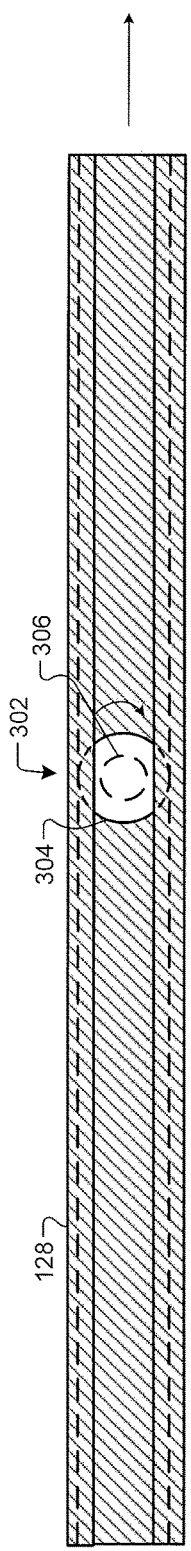
FIGS. 6A and 6B are side views of a roller engaged with a support structure in accordance with another embodiment of the present disclosure.
Figure 6B:
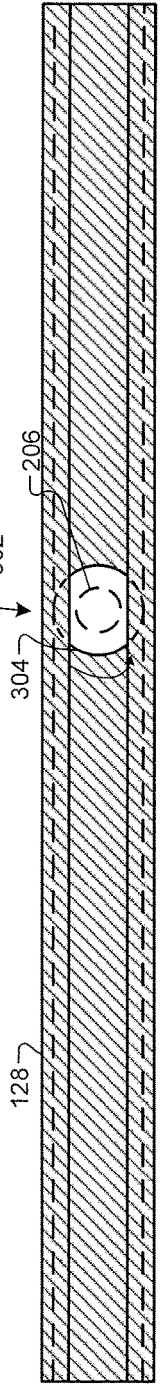

FIGS. 6A and 6B illustrates relative movement of the internal support structure 128 and the housing 118 due to rotation of the roller 306 engaged with the support structure 128. The roller assemblies 302 are rotated by the actuator 106 to cause a server 104 to transition from a retracted position to an extended position, or vice versa. For example, the server 104 is transitioned to the extended position to increase exposure of the heat sink 114 to airflow. The server 104 extends beyond a longitudinal plane parallel to a surface 208 of the vertical post 108 (see FIG. 4).

Figure 7:
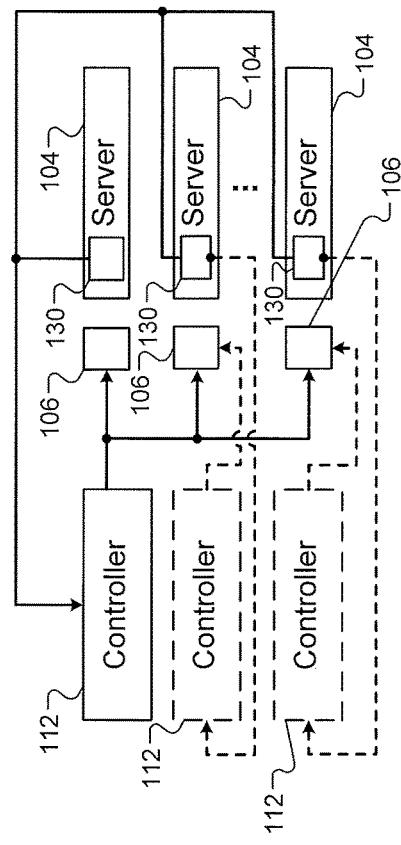
FIG. 7 is a block diagram of a control system in accordance with an example embodiment of the present disclosure.

As shown in FIG. 7, the server system 100 includes the one or more controllers 112 that operate the one or more actuators 106. The controller 112 causes the one or more actuators 106 to actuate based upon a heat load of the server system 100. The controller 112 generates an actuator control signal based upon the heat load to control operation of the actuators 106.

In an embodiment, sensors 130 are mounted on the server 104. In an embodiment, a first sensor 130-1 can be attached to a surface 132 of the heat sink 114, and a second sensor 130-2 can be attached to a surface 134 of the housing 118. In various examples, the sensors 130-1, 130-2 can be attached to the surface 132 and/or the surface 134 using a thermally conductive adhesive, fasteners, or the like. The sensors 130 measure one or more characteristics indicative of a heat load.

In an embodiment, the first sensor 130-1 measures the temperature of the heat sink 114, and the second sensor 130-2 measures the temperature of the housing 118. The measured temperature of the heat sink 114 and/or the housing 118 can be indicative of a heat load of the server 104.

The server 104 can also provide one or more operational characteristics that are indicative of the heat load. For example, the server 104 determines power usage (i.e., current, voltage, or power), determines operational speed and/or frequency, and/or determines utilization (i.e., number of jobs to be executed or already executed). The power usage, operational speed and/or frequency, and/or utilization of the server 104 can be indicative of the heat load. The server 104 can provide these operational characteristics to the controller 112.

The controller 112 receives the heat load as input from the sensors 130 and/or the servers 104. The controller 112 compares the heat load to a predetermined heat load threshold. In an embodiment, the predetermined heat load threshold is based upon a desired operating temperature of the server 104 and its electronic devices. The desired operating temperature refers to a temperature at which the electronic devices operate without risk of damage from heat produced by the operation of the electronic devices.

When the heat load exceeds the predetermined heat load threshold, the controller 112 generates an actuator control signal causing the server 104 to transition from a first position to a second position via the actuator 106. In an embodiment, the controller 112 can generate an actuator control signal to cause one or more actuators 106 to rotate the server 104 when the controller 112 determines the measured heat load of the server 104 exceeds the predetermined heat load threshold. Based upon the rotation of the server 104, the housing 118 and/or the heat sink 114 can be exposed to the airflow to remove heat generated by the server 104 via convection.

In another embodiment, the controller 112 generates an actuator signal to cause one or more actuators 106 to extend a server 104 when the controller 112 determines the measured heat load of the server 104 exceeds the predetermined heat load threshold. Based upon the extended state of the server 104, an increased surface area of the housing 118 and/or the heat sink 114 is exposed to the airflow to remove heat generated by the server 104 from the surrounding environment.

In some embodiments, a single controller 112 can be employed by the server system 100 to control the actuators 106 of the server system 100. In this embodiment, the single controller 112 is in communication with each of the sensors 130 deployed throughout the server system 100. In other embodiments, each server 104 employs a controller 112 to control the actuators 106 of the respective server 104. In this embodiment, the sensors 130 of each server 104 provide the measured heat loads to the corresponding controller 112, and the controller 112 controls the corresponding actuator 106 based upon the measured heat load. It is understood that other controller 112 configurations can also be employed.

Figure 8A:
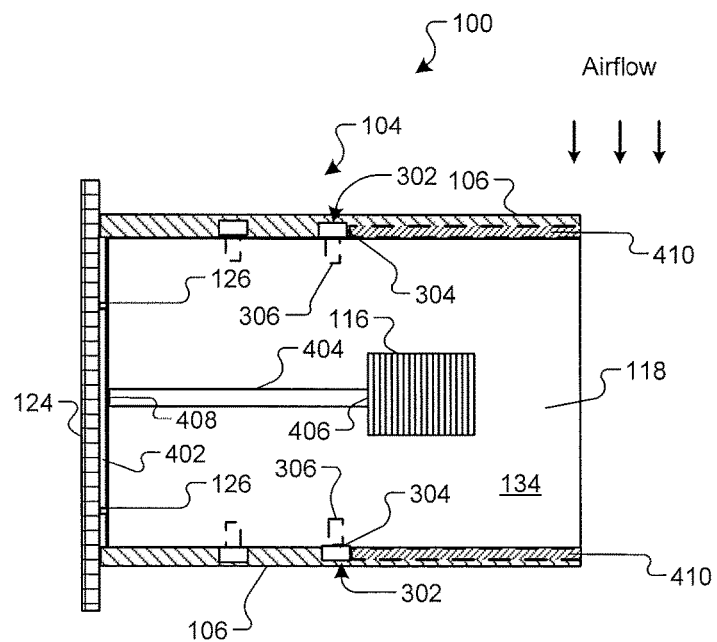
FIGS. 8A and 8B are plan views of a server in accordance with an example embodiment of the present disclosure.
Figure 8B:
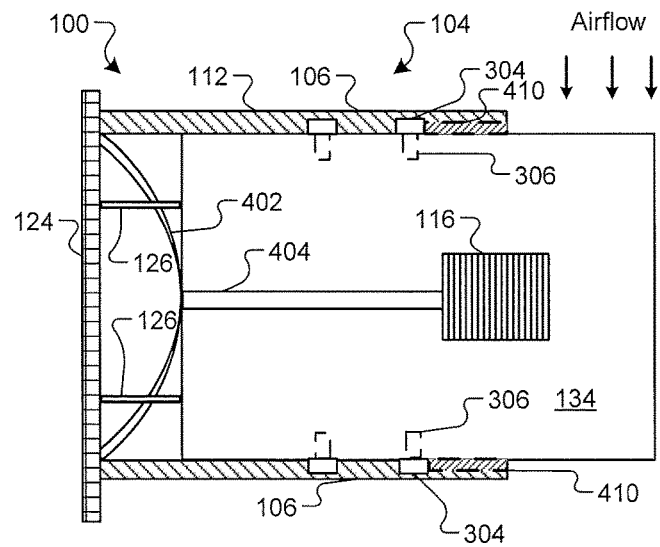
Figure 8C:
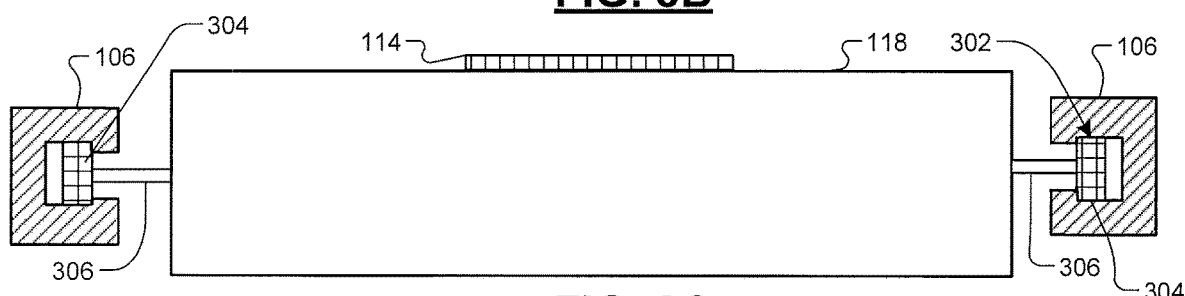
FIG. 8C is a side view of a server connected to roller assemblies, and the roller assemblies are received by a lateral support structure in accordance with an example embodiment of the present disclosure.
Figure 9:
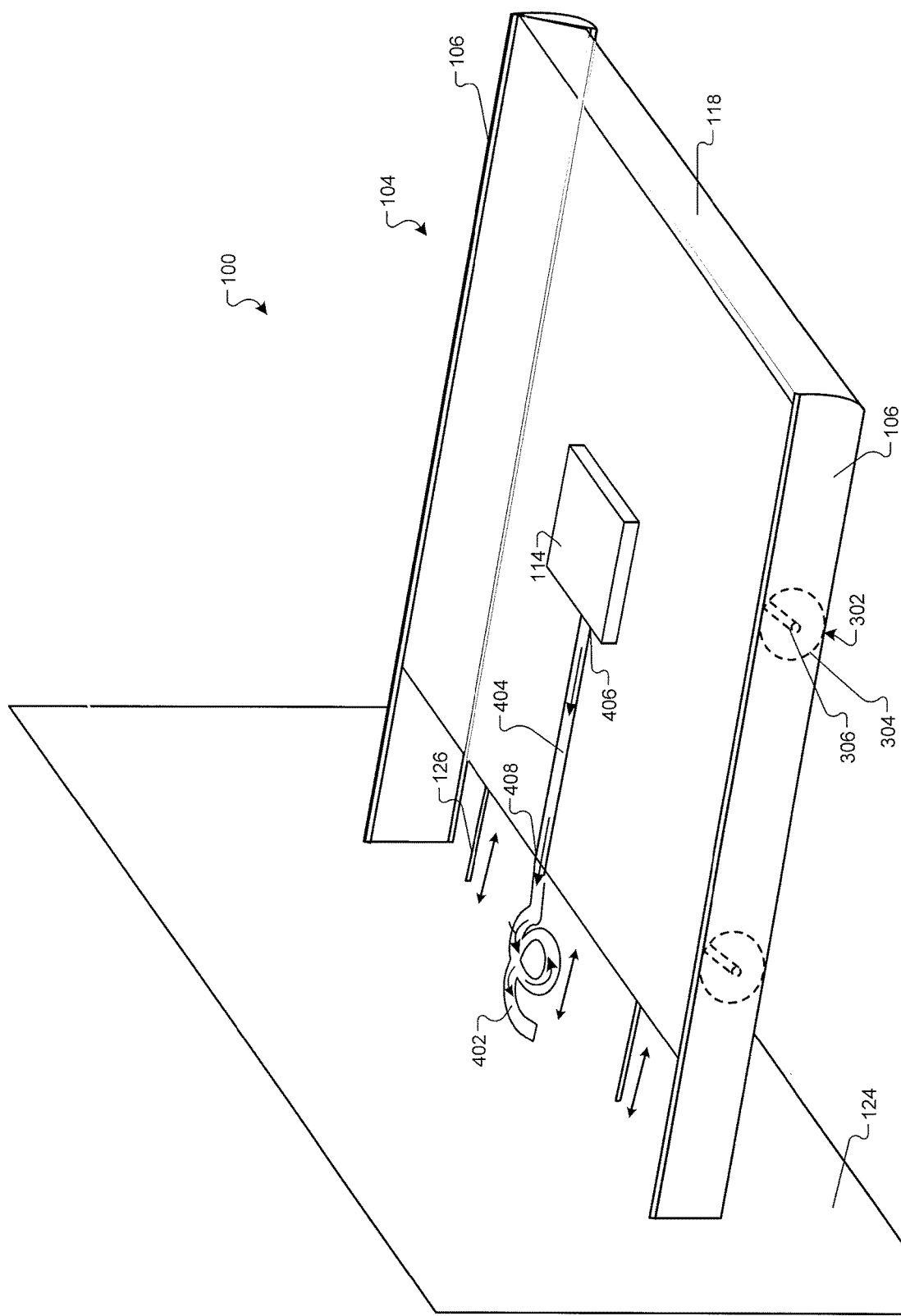
FIG. 9 is an isometric view of a server in accordance with an example embodiment of the present disclosure.

FIGS. 8A through 9 illustrate example embodiments of the server system 100 that include a heat-activated actuator 402. In one example, the heat-activated actuator 402 includes a heat deformable material, such as a shape-memory alloy. In various embodiments, the heat deformable material includes a two-way shape-effect characteristic that maintains a first shape at a first temperature (i.e., a relatively low temperature) and transitions to a second shape at a second temperature (i.e., a relatively high temperature). The material of the heat-activated actuator can be selected based upon the desired operating temperature of the server 104 and its electronic devices. Additionally, the shape and configuration of the heat-activated actuators 402 may vary depending upon the server system 100. For example, as shown in FIGS. 8A and 8B, the heat-activated actuator 402 includes a shape that differs with respect to a shape of the heat-activated actuator 402 shown in FIG. 9.

The server 104 includes the heat sink 114 and a heat pipe 404 in thermal communication with the heat sink 114 and the heat-activated actuator 402. The heat pipe 404 includes an inlet 406 that is coupled to the heat sink 114 and an outlet 408 that is coupled to the heat-activated actuator 402. As shown, a body of the heat pipe 404 longitudinally extends along the surface 134 of the housing 118 between the heat sink 114 and the heat-activated actuator 402. In embodiments, the heat pipe 404 includes any suitable material that can transfer and/or conduct heat. For example, the heat pipe 404 includes copper, silver, gold, combinations thereof, or the like.

The housing 118 is connected to the lateral support structures 110 by way of a plurality of roller assemblies 302. In embodiments, as shown in FIG. 8C, the lateral support structures 110 define a rail structure or track structure to receive the rollers 304 allowing the housing 118 to retract and extend based upon the state of the heat-activated actuator 402. The axles 306 of the roller assemblies 302 can be connected to the housing 118 by way of a corresponding bore.

The heat sink 114 absorbs heat from the housing 118 and provides the absorbed heat to the heat pipe 404 via the inlet 406. The heat pipe 404 provides heat to the outlet 408, and the outlet 408 provides the heat to the heat-activated actuator 402. The heat-activated actuator 402 transitions from a retracted state to an extended state when the temperature of heat-activated actuator 402 exceeds an expansion temperature as shown in FIGS. 8A, 8B, and 9. As the heat-activated actuator 402 transitions from the retracted state to the extended state, the heat-activated actuator 402 exerts a force on the housing 118. The force exerted causes the housing 118 to extend to expose the housing 118 and/or the heat sink 114 to the airflow.

When the temperature of the heat-activated actuator 402 is below a retraction temperature, the heat-activated actuator 402 transitions from the extended state to the retracted state, which causes the housing 118 to retract within the frame 102. In various embodiments, the heat-activated actuator 402 is fastened to the housing 118. The heat-activated actuator 402 can be fastened to the housing 118 using an adhesive, bolts, screws, or the like.

The lateral support structures 110 can include elastic devices 410 that exert a force on the rollers 304 opposite to the force that is exerted on the housing 118 by the heat-activated actuator 402. For example, the elastic devices 410 include compression springs, or the like. When the heat-activated actuator 402 transitions to the retracted state, the force exerted on the rollers 304 by the elastic devices 410 exceeds the force exerted on the housing 118 due to retraction. The elastic devices 410 include a force constant characteristic that allows the elastic devices 410 to compress to allow the housing 118 to transition from the retracted position to the extended position. The server system 100 illustrated in FIG. 9 can also employ roller assemblies 302 that engage the lateral support structure 110 to allow the housing 118 to transition between a retracted position and an extended position, and vice versa.

Figure 10:
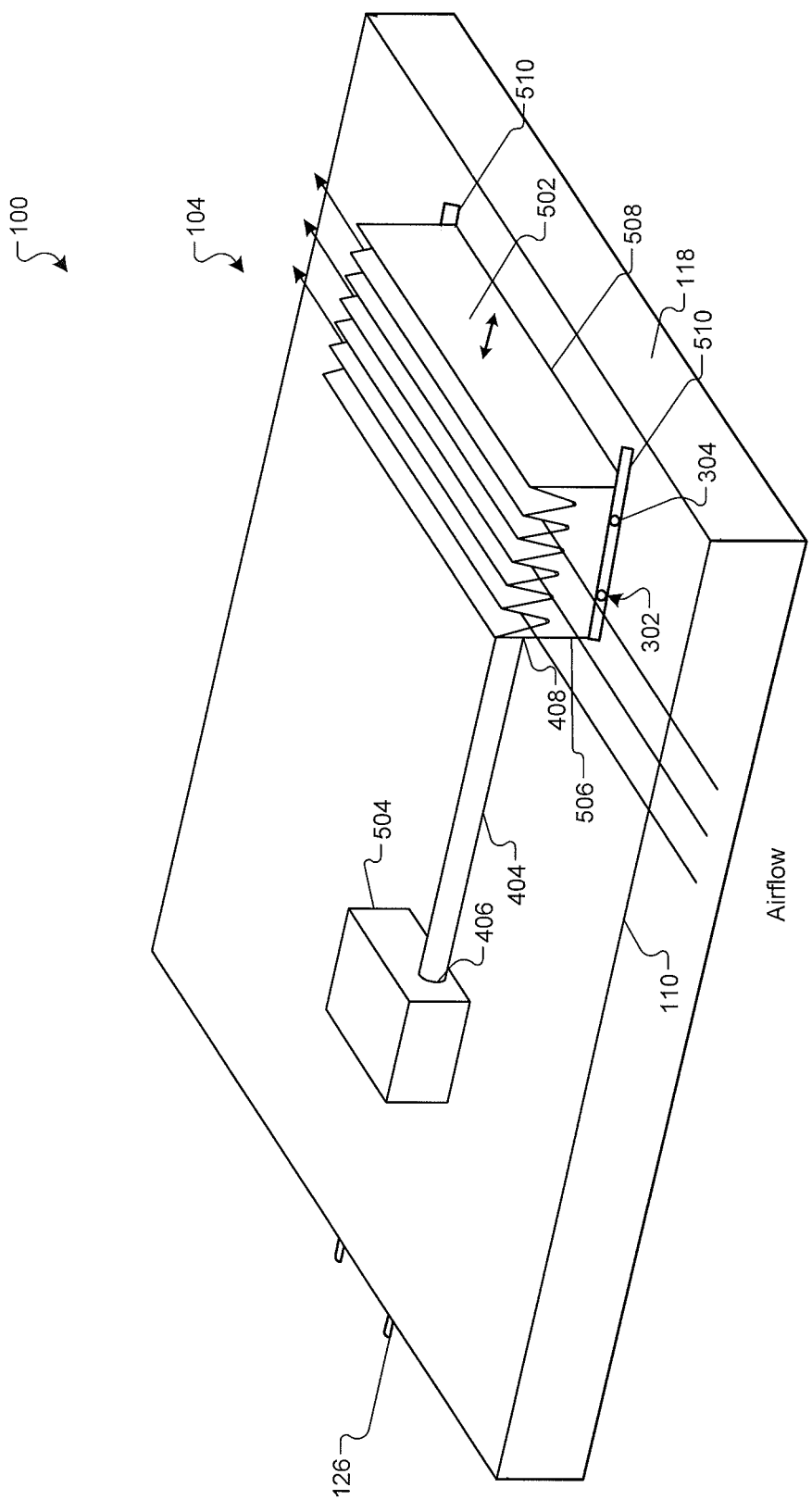
FIG. 10 is an isometric view of a server in accordance with an example embodiment of the present disclosure.

FIG. 10 illustrates an example embodiment of the server system 100 that includes an expandable heat sink 502. As shown, the expandable heat sink 502 and a heat-generating device 504, such as an electronic device, are mounted to the housing 118 of the server 104. The inlet 406 of the heat pipe 404 is in thermal communication with the heat-generating device 504, and the outlet of the heat pipe 404 is in thermal communication with the expandable heat sink 502. In various embodiments, the expandable heat sink 502 includes heat deformable material, such as a shape-memory alloy, or the like.

The heat pipe 404 provides heat generated by the heat-generating device 504 to the expandable heat sink 502. Once the temperature of the expandable heat sink 502 exceeds its expansion temperature, the expandable heat sink 502 transitions from a retracted state to an expanded state to increase exposure of the expandable heat sink 502 to the airflow. Once the temperature of the expandable heat sink 502 is below its retraction temperature, the expandable heat sink 502 transitions from the expanded state to the retracted state.

In an embodiment, a first portion 506 of the expandable heat sink 502 is fixedly attached to the housing 118, and a second portion 508 of the expandable heat sink 502 is translationally attached to the housing 118. For example, a guiding structure 510 is attached to the housing 118, and the expandable heat sink 502 is retained within the guiding structure 510. In an embodiment, the guiding structure 510 is a track structure that guides the expandable heat sink 502 during expansion and retraction. For example, one or more roller assemblies 302 may be attached to expandable heat sink 502. The rollers 304 of the rollers assemblies 302 can transition within the guiding structure 510 during expansion and/or retraction of the expandable heat sink 502.

Figure 11:
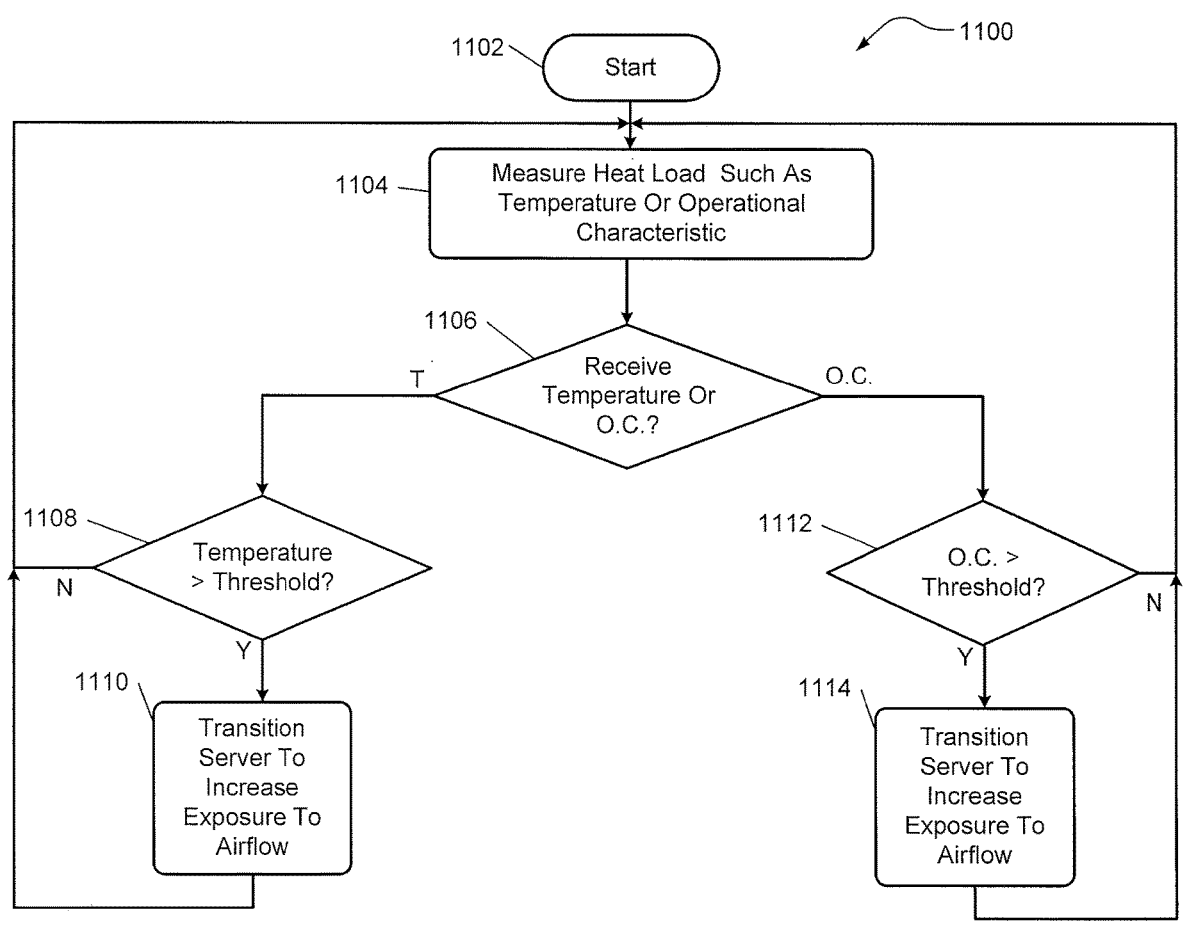
FIG. 11 is a flowchart illustrating an example method for transitioning a server between a retracted position and an extended position based upon a heat load in accordance with an example embodiment of the present disclosure.

FIG. 11 illustrates an example method 1100 for transitioning a server 104 between a retracted position and an extended position based upon a heat load. The method 1100 begins at 1102. At 1104, a heat load is measured. In an embodiment, a sensor 130 measures a heat load associated with the server 104. At 1106, the method determines whether a temperature (T) or an operational characteristic (O.C.) is received.

At 1108, if a temperature was received, the method determines whether the temperature exceeds a predetermined temperature threshold. For example, the controller 112 compares the measured temperature with a predetermined temperature threshold. If the temperature does not exceed the predetermined temperature threshold, the method 1100 transitions to 1104. If the temperature exceeds the predetermined environmental threshold, a server transitions from a first position to a second position to increase a surface area of the server exposed to the airflow at 1110. For example, the controller 112 generates an actuator control signal to rotate the server 104 from a first position to a second position to increase a surface area of the heat sink 114 or the housing 118 exposed to the airflow. In another example, the controller 112 generates the actuator control signal to cause the actuator to translationally extend the server 104, with respect to the frame 102, to increase the surface area of the heat sink 114 or the housing 118 exposed to the airflow.

At 1112, if an operational characteristic was received, the method determines whether the operational characteristic exceeds a predetermined operational characteristic threshold. For example, the controller 112 compares the operational characteristic with a predetermined operational characteristic threshold. If the operational characteristic does not exceed the predetermined operational characteristic threshold, the method 1100 transitions to 1104. If the operational characteristic exceeds the predetermined operational characteristic threshold, a server transitions from a first position to a second position to increase a surface area of the server exposed to the airflow. For example, the controller 112 generates the actuator control signal to rotate the server 104 from a first position to a second position to increase a surface area of the heat sink 114 or the housing 118 exposed to the airflow. In another example, the controller 112 generates the actuator control signal to translationally extend the server 104 to increase the surface area of the heat sink 114 or the housing 118 exposed to the airflow.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

The invention claimed is:

1. A server system, comprising:
   a frame including a support structure;
   a server supported by the support structure, the server generating heat during operation and being exposed to an airflow inside the frame to transfer the generated heat away from the server; and
   an actuator mechanically coupled to the support structure inside the frame, the actuator being configured to, in response to a control signal, cause the server to transition from a first position inside the frame to a second position inside the frame relative to the actuator to increase exposure of the server to the airflow inside the frame to transfer the generated heat away from the server via convection when a temperature of the actuator exceeds a predetermined temperature and from the second position to the first position relative to the actuator to decrease exposure of the server to the airflow inside the frame when the temperature of the actuator is below the predetermined temperature.

2. The server system of claim 1, further comprising:
   a heat sink mounted on the server;
   a sensor mounted to at least one of the heat sink or the server, wherein the sensor is configured to measure a heat load associated with the server; and
   a controller configured to cause the actuator to actuate the server from the first position to the second position when the heat load exceeds a predetermined heat load.

3. The server system of claim 2, wherein the heat load comprises at least one of a temperature associated with the server and an operational characteristic associated with the server.

4. The server system of claim 1, wherein the actuator is configured to cause the server to rotate relative to the frame.

5. The server system of claim 4, further comprising:
   an axle connected to the server; and
   a gear assembly connected to the axle, wherein the gear assembly is rotationally connected to the actuator, wherein the axle causes the server to rotate when the actuator causes the gear assembly to rotate.

6. The server system of claim 1, wherein the actuator is configured to cause the server to at least one of extend or retract with respect to the frame.

7. The server system of claim 6, further comprising:
   an inner support structure connected to the support structure and configured to retain the server; and
   a roller assembly connected to the actuator and the inner support structure, wherein the roller assembly is configured to at least one of extend or retract the inner support structure with respect to the support structure.

8. The server system of claim 7, wherein the roller assembly includes a roller and an axle, wherein the roller is connected to the axle and the axle is rotationally connected to the actuator.

9. The server system of claim 1, further comprising:
   a server interface configured to connect with the server.

10. The server system of claim 9, further comprising:
    one or more extendable connectors configured to connect the server with the server interface.

11. The server system of claim 1, wherein the actuator comprises a heat-activated actuator connected to the server.

12. The server system of claim 11, wherein the heat-activated actuator comprises a shape-memory alloy.

13. A server system, comprising:
    a frame including a support structure carrying a server, the frame being configured to receive an airflow through the frame, wherein the server carried by the support structure is exposed to the airflow inside the frame to transfer heat away from the server; and
    an actuator mechanically coupled to the support structure inside the frame, the actuator being configured to, in response to a control signal, drive the server carried by the support structure from a first position inside the frame to a second position inside the frame relative to the actuator to increase exposure of the server to the airflow inside the frame to transfer the generated heat away from the server via convection when a temperature of the actuator exceeds a predetermined temperature, and from the second position inside the frame to the first position inside the frame relative to the actuator to decrease exposure of the server to the airflow inside the frame when the temperature of the actuator is below the predetermined temperature.

14. The server system of claim 13, further comprising:
    a sensor configured to measure a heat load of the server; and
    a controller configured to generate the control signal instructing the actuator to move the server from the first position to the second position when the measured heat load exceeds a predetermined threshold.

15. The server system of claim 13, further comprising:
    a sensor configured to measure a temperature of the server; and
    a controller configured to generate the control signal instructing the actuator to move the server from the first position to the second position when the measured temperature exceeds a predetermined threshold.

16. The server system of claim 13, further comprising:
    a roller assembly mechanically coupling the actuator and the support structure, wherein the roller assembly is configured to extend or retract the support structure carrying the server with respect to the frame.

17. The server system of claim 13, further comprising:
a roller assembly mechanically coupling the actuator and the support structure, the roller assembly having a roller and an axle connected to the roller and is rotationally connected to the actuator, wherein the roller assembly is configured to extend or retract the support structure carrying the server with respect to the frame.

18. A method comprising:
measuring, via a sensor at least proximate a server carried by a support structure inside a frame, a heat load of the server carried by the support structure, the server being exposed to an airflow inside the frame to transfer heat away from the server via convection;
determining whether the measured heat load of the server exceeds a predetermined threshold; and
in response to determining that the measured heat load of the server exceeds the predetermined threshold, generating and transmitting a control signal to an actuator mechanically coupled to the support structure inside the frame to drive the server carried by the support structure from a first position inside the frame to a second position inside the frame relative to the actuator to increase exposure of the server to the airflow inside the frame, thereby increasing heat transfer from the server to the airflow inside the frame via convection and from the second position inside the frame to the first position inside the frame relative to the actuator to decrease exposure of the server to the airflow inside the frame when the measured heat load of the server is below the predetermined threshold.

19. The method of claim 18 wherein generating and transmitting the control signal includes generating and transmitting the control signal to the actuator to extend or retract the support structure carrying the server with respect to the frame and to the actuator.

20. The method of claim 18 wherein the server system further includes a roller assembly mechanically coupling the actuator and the support structure, the roller assembly having a roller and an axle connected to the roller and is rotationally connected to the actuator, wherein generating and transmitting the control signal includes generating and transmitting the control signal to the actuator to drive the roller assembly, thereby extending or retracting the support structure carrying the server with respect to the frame and to the actuator.

* * * * *